United States Patent [19]

Matsui

[11] Patent Number: 4,512,954
[45] Date of Patent: Apr. 23, 1985

[54] CRYSTAL GROWING APPARATUS

[75] Inventor: Toshiro Matsui, Hyogo, Japan

[73] Assignee: Tokyo Shibaura Denki Kabushiki Kaisha, Kawasaki, Japan

[21] Appl. No.: 521,826

[22] Filed: Aug. 10, 1983

[30] Foreign Application Priority Data

Aug. 19, 1982 [JP] Japan .................................. 57-143707

[51] Int. Cl.³ .............................................. C30B 15/20
[52] U.S. Cl. .................................... 422/106; 156/601; 422/108; 422/109; 422/110
[58] Field of Search ................. 156/601, 617 SP, 602; 422/249, 106, 109, 108, 110

[56] References Cited

U.S. PATENT DOCUMENTS

| | | | |
|---|---|---|---|
| 3,980,438 | 9/1976 | Castronguay et al. | 422/108 |
| 4,185,076 | 1/1980 | Hatch et al. | 156/617 SP |
| 4,350,557 | 9/1982 | Scholl et al. | 156/617 SP |

Primary Examiner—Hiram H. Bernstein
Assistant Examiner—John Donofrio
Attorney, Agent, or Firm—Cushman, Darby and Cushman

[57] ABSTRACT

In a crystal growing apparatus, an electrode is arranged above a crystal raw material melt at a distance therefrom. Changes in the resistance of the atmosphere between the electrode and the melt are detected so as to detect the surface level of the melt. The crystal pulling speed or power supply for heating the melt is controlled in accordance with the detection result, thereby performing dimension control of the crystal.

4 Claims, 3 Drawing Figures

CRYSTAL GROWING APPARATUS

BACKGROUND OF THE INVENTION

The present invention relates to a crystal growing apparatus for growing crystals by the Czochralski method or by the ribbon pulling method.

The Czochralski method or ribbon pulling method is widely applied to the production of a crystal ingot of silicon or the like. In a crystal growing apparatus adopting the Czochralski method, polysilicon and a dopant (impurity) as raw materials are charged in a quartz crucible. The crucible is heated to hold a melt of the raw materials therein. A seed crystal attached at the lower end of a pulling shaft is brought into contact with the melt held in the crucible while the pulling shaft is gradually pulled upward. Thus, a crystal is grown on the lower end of the seed crystal. Meanwhile, in a crystal growing apparatus adopting the ribbon pulling method, the sectional shape of a melt is regulated to be rectangular so as to prepare a ribbon-shaped crystal.

However, in the conventional apparatus as described above, as the crystal grows, the amount of the melt in the crucible linearly decreases. For this reason, it has been difficult to produce a crystal ingot having a constant diameter or a ribbon-shaped crystal having a constant width and thickness. Furthermore, since polysilicon can only be supplied to the crucible in the charging step prior to pulling, the raw materials for only one pulling step can be charged in the crucible. This requires charging of polysilicon for each pulling step, which is uneconomic.

In order to solve these problems, it has been proposed to incorporate a raw material replenishment means in a crystal pulling mechanism. However, the techniques of such replenishment of raw materials do not resolve the problems of either short supply of raw materials in the crucible or of overflow of raw materials from the crucible. This proposal therefore has not actually been adopted.

SUMMARY OF THE INVENTION

It is an object of the present invention to provide a crystal growing apparatus which has a means for detecting a raw material level in a crucible with ease and reliability, so that continuous crystal growth can be performed in the pulling direction while maintaining other crystal dimensions constant.

In order to achieve the above object of the present invention, there is provided a crystal growing apparatus for growing a crystal by preparing a crystal raw material melt in a crucible, bringing a seed crystal into contact with the melt and pulling the seed crystal, comprising an electrode arranged above the melt at a distance therefrom, means for detecting a change in a resistance of an atmosphere between the electrode and the melt, and means for controlling a pulling speed of the crystal or power supply for heating the melt in accordance with a detection output from the detecting means, thereby controlling a dimension of the crystal.

DETAILED DESCRIPTION OF THE PREFERRED EMBODIMENTS

In a crystal growing apparatus of the present invention, an electrode is arranged above a crystal raw material melt at a distance therefrom. Changes in the resistance of the atmosphere between the electrode and the melt are detected to thereby detect the surface level of the melt. The crystal pulling speed or supply of power for heating the melt is controlled in accordance with the detection result.

The atmosphere around the crucible is generally Ar gas. According to an experiment conducted by the present inventor, it was found that a current passes through the atmosphere when an electrode is arranged over a melt at a distance therefrom and a voltage is applied between the electrode and the melt. It was also found that the atmospheric resistance increases exponentially in accordance with a descent in the surface level of the melt in the crucible. Although it is not clear whether these results are caused by ion conduction of a high-temperature gas or other mechanisms, the present invention utilizes these empirical results.

The present invention will now be described in detail with reference to the accompanying drawings.

Figure 1:
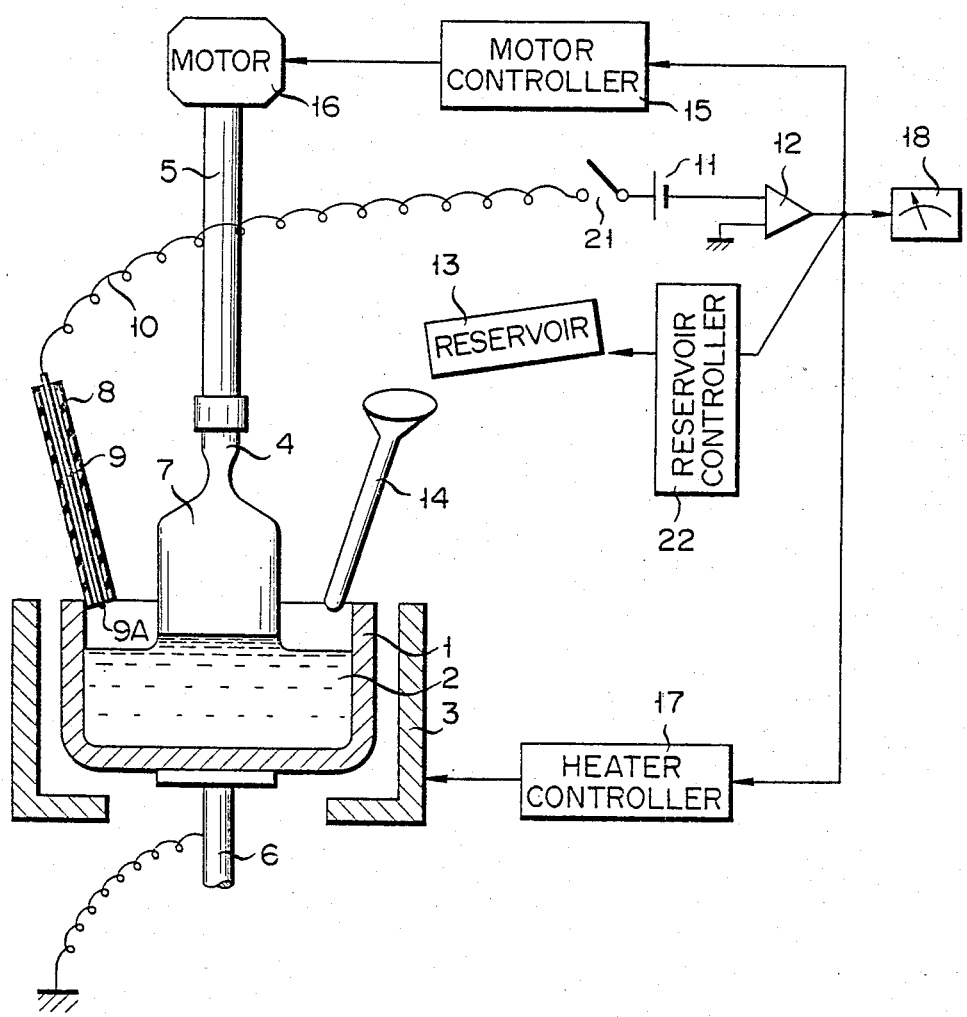
FIG. 1 is a schematic view showing a crystal growing apparatus according to an embodiment of the present invention.

FIG. 1 shows the schematic structure of a crystal growing apparatus according to an embodiment of the present invention. Referring to FIG. 1, reference numeral 1 denotes a quartz crucible; 2, a silicon melt held in the crucible 1; 3, a heater arranged around the crucible 1; 4, a seed crystal shown in contact with the silicon melt 4; 5, a pulling shaft for pulling the seed crystal 4; 6, a crucible shaft rotated by a motor (not shown); and 7, a pulled silicon crystal. The basic structure of the apparatus remains the same as that of a conventional apparatus. However, in the apparatus of the present invention, an electrode 9 protected by a quartz tube 8 is arranged above the melt 2 held in the crucible 1. A distal end 9A of the electrode 9 consists of a p-type silicon carbide, and the proximal end is guided to the outside of the apparatus to be connected to the positive terminal of a dc power supply 11 through a lead wire 10 and a switch 21. The negative terminal of the dc power supply 11 is connected to one input terminal of a logarithmic operational amplifier 12. The other input terminal of the amplifier 12 is grounded. The crucible shaft 6 is also grounded by means of an electric brush or the like. A signal of a current passing in the atmosphere between the electrode 9 and the melt 2 appears at the output terminal of the amplifier 12. A reservoir 13 and a funnel 14 for supplying raw materials to the crucible 1 are arranged thereabove. The reservoir 13 has a reservoir controller 22 which includes a solenoid coil. The reservoir controller 22 controls the tilt angle of the reservoir 13 in accordance with an output signal from the amplifier 12 so as to control the amount of raw materials replenished to the crucible 1.

Reference numeral 15 denotes a motor controller for regulating a pulling motor 16 which drives the pulling shaft 5, and 17 denotes a heater controller which controls power supply to the heater 3. An output signal from the amplifier 12 is selectively supplied to one or both of the controllers 15 and 17 so as to control the diameter of the crystal. The output terminal of the amplifier 12 is also connected to a level indicator 18.

The mode of operation for silicon crystal growth according to the apparatus as described above will now be described. After charging 200 g of polysilicon powder and boron as a dopant in the crucible 1, they are melted by the heater 3 to prepare the silicon melt 2. Then, the seed crystal 4 is mounted at a seed crystal chuck (not shown) of the pulling shaft 5 disposed above the crucible 1. The pulling shaft 5 is lowered to dip the lower end of the seed crystal 4 in the melt 2 held in the crucible 1. Subsequently, the pulling shaft 5 is rotated while the seed crystal 4 is gradually pulled upward. Then, the crystal attached to the lower end of the seed crystal 4 grows. The rotational frequency of the pulling shaft 5 is optimally 6 to 10 rpm, and the pulling speed is preferably 2 mm/min. As the seed crystal is being pulled upward, the crucible shaft 6 is rotated by a motor (not shown). The crucible shaft 6 is grounded as described above. In the initial period of crystal growth, the diameter of the melt pulled at the lower end of the seed crystal 4 is relatively small. Then, the diameter of the pulled crystal 7 becomes large and stabilizes. The reservoir controller 22 for controlling the reservoir 13 is operated such that the polysilicon powder is continuously supplied from the reservoir 13 to the crucible 1 from a timing before the diameter of the pulled crystal stabilizes. When the diameter of the pulled crystal 7 has stabilized, the switch 21 of the dc power supply 11 is turned on to apply a dc bias to the electrode 9. The conduction current is amplified by the amplifier 12, and an output signal from the amplifier 12 is supplied to the level indicator 18 which indicates the surface level of the melt. The output signal from the amplifier 12 is also supplied to the reservoir controller 22.

Figure 2:
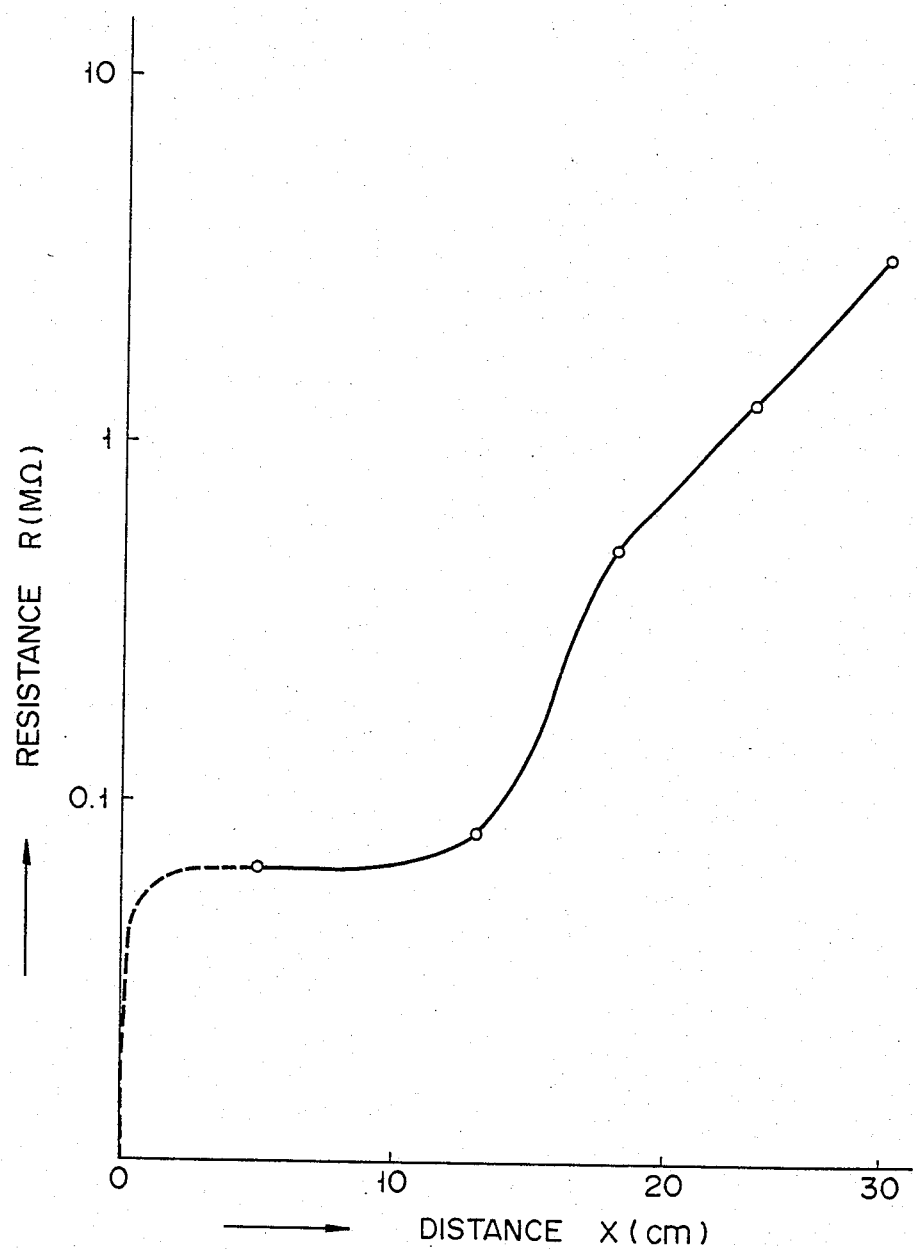
FIG. 2 is a graph showing the resistance between an electrode and a crystal raw material melt of the apparatus shown in FIG. 1 as a function of the distance therebetween.

According to measurements made by the present inventors, when the distance between the surface level of the melt 2 and the electrode 9 is defined as X, the resistance R ($\Omega/cm^2$) therebetween is obtained as shown in FIG. 2. This may be expressed by the following equation:

$$R = 7.5 \times 10^5 \, exp \, (1.6X)$$

According to the apparatus of this embodiment, a decrease in the amount of the melt 2 upon the pulling operation of the seed crystal 4 is detected by the electrode 9. Then, the amount of the raw materials supplied to the crucible 1 is controlled in accordance with the relation given above. As a consequence, continuous and stable crystal growth can be performed. Furthermore, in the embodiment of the present invention, since continuous crystal growth can be performed, the length of the ingot can be made extremely long, resulting in a significant increase in the production yield. Since an additive such as an impurity can be supplied in a suitable amount to the reservoir 13 in advance, exponential change in the impurity concentration can be corrected and uniform crystals can be continuously manufactured.

If the diameter of the pulled crystal 7 is large, the surface of the melt 2 near the crucible 1 is inclined. The distal end 9A of the electrode 9 then opposes the inclined surface of the melt 2. This leads to a decrease in the distance X and hence to an increase in the conduction current. However, data on this is supplied to the motor controller 15 which supplies to the motor 16 a control signal to increase the pulling speed in accordance with the input data. Then, a decrease in the diameter is effected, so that the increase in the diameter is effectively suppressed. In this manner, the diameter of the pulled crystal is kept constant.

Similar dimension control of a grown crystal can also be performed by controlling supply of power to the heater 3 by means of the heater controller 17.

Figure 3:
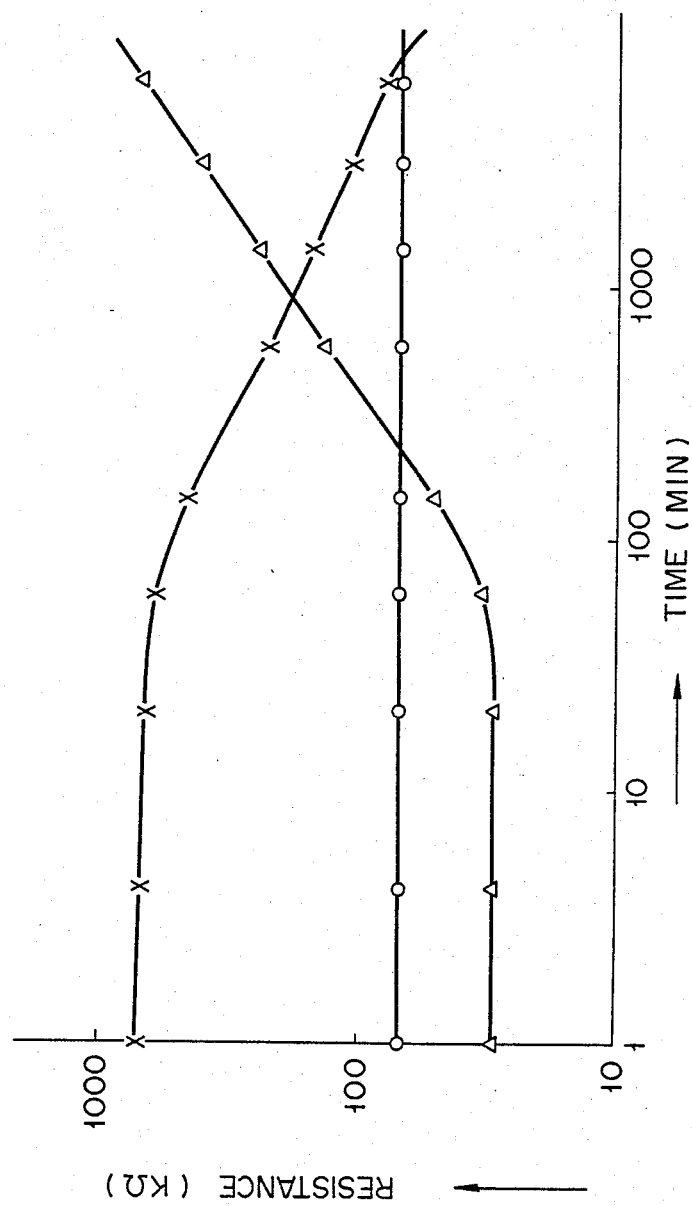
FIG. 3 is a graph showing how the resistance of the electrode changes with time.

The distal end 9A of the electrode 9 consists of a p-type silicon carbide which is stable against use over a long period of time. The experimental data on this is shown in FIG. 3. FIG. 3 shows curves (indicated by a circle for the case wherein a p-type silicon carbide is used for the distal end 9A of the electrode 9, indicated by symbol x for the case wherein graphite is used, and indicated by a triangle for the case wherein an n-type silicon carbide is used) representing the changes in resistance as a function of time. These results were obtained in an experiment wherein the distance X was kept constant at 20 mm and other crystal growing conditions remained the same as these in a conventional apparatus. It may be seen from this experimental data that the electrode constituted by a p-type silicon carbide gives rise to only a small change in resistance over time and is reliable as a surface level detector.

The present invention is described with reference to a case wherein the distal end 9A of the electrode 9 comprises a p-type silicon carbide. However, if too high durability is not required, a p-type silicon carbide need not be used and other materials may be used.

In the crystal growing apparatus of the present invention, the surface level of a crystal raw material melt can be detected with ease and reliability, and dimension control of the pulled crystal can be performed in accordance with the detection result. Dimension control means diameter control in the Czochralski method, and thickness and width control in the ribbon pulling method. The apparatus of the present invention also facilitates continuous replenishment of the raw materials during crystal growth. According to the apparatus of the present invention, since the electrode is arranged so as not to contact the melt, a surface level detector which has a simple structure and which has an excellent durability can be obtained. When an electrode consists of a p-type silicon carbide, a surface level detector can be obtained which gives rise to only a small change in resistance over time.

What is claimed is:

1. A crystal growing apparatus for growing a crystal by preparing a crystal raw material melt in a crucible, bringing a seed crystal into contact with the melt and pulling the seed crystal, comprising:
   an electrode arranged above the melt at a distance therefrom,
   means for detecting a change in a resistance of an atmosphere between said electrode and the melt, and
   means for controlling a pulling speed of the crystal in accordance with a detection output from said detecting means, thereby controlling a dimension of the crystal.

2. An apparatus according to claim 1, wherein a distal end of said electrode which faces the melt consists of a p-type silicon carbide.

3. A crystal growing apparatus for growing a crystal by preparing a crystal raw material melt in a crucible, bringing a seed crystal into contact with the melt and pulling the seed crystal, comprising:
   an electrode arranged above the melt at a distance therefrom, means for detecting a change in a resistance of an atmosphere between said electrode and the melt, and means for controlling a power supply for heating the melt in accordance with a detection output from said detecting means, thereby controlling a dimension of the crystal.

4. An apparatus according to claim 3 wherein a distal end of said electrode which faces the melt consists of a p-type silicon carbide.

* * * * *